United States Patent [19]

Kawada

[11] Patent Number: 5,626,277

[45] Date of Patent: May 6, 1997

[54] MOUNTING APPARATUS OF SOLDER-BALLS

[75] Inventor: Yasuo Kawada, Kanagawa, Japan

[73] Assignee: Sony Corporation, Tokyo, Japan

[21] Appl. No.: 516,823

[22] Filed: Aug. 18, 1995

[30] Foreign Application Priority Data

Aug. 19, 1994 [JP] Japan .................... 6-217901

[51] Int. Cl.$^6$ .................. B23K 3/00; B23K 3/06
[52] U.S. Cl. ........................... 228/41; 228/246
[58] Field of Search ............... 228/41, 246, 254, 228/224, 56.3; 221/211

[56] References Cited

U.S. PATENT DOCUMENTS

| 4,462,534 | 7/1984 | Bitaillou et al. | 228/246 |
| 4,830,264 | 5/1989 | Bitaillou et al. | 228/223 |
| 5,467,913 | 11/1995 | Namekawa et al. | 228/41 |
| 5,516,032 | 5/1996 | Sakemi et al. | 228/246 |

*Primary Examiner*—Samuel M. Heinrich
*Attorney, Agent, or Firm*—Hill, Steadman & Simpson

[57] ABSTRACT

A solder-ball mounting apparatus is provided with a ball feed jig having a ball tank that may receive a predetermined number of solder-balls for feeding the solder-balls to a ball suction jig through a guide mask mounted on an opening portion of the ball tank, and blowout holes formed in a bottom of the ball tank for a blow gas as a blow unit for agitating the solder-balls received in the ball tank in the ball feed jig. The solder-balls may be positively sucked to ball suction holes one by one without turning over the ball suction jig.

19 Claims, 6 Drawing Sheets

MOUNTING APPARATUS OF SOLDER-BALLS

BACKGROUND OF THE INVENTION

1. Field of the Invention

The present invention relates to a mounting apparatus of solder-balls for mounting solder-balls on a circuit substrate in a ball forming step for a BGA (Ball Grid Array) package in which IC chips are mounted on one side surface of a circuit substrate and solder-balls are formed on the other side surface, for example, among various semiconductor package forms.

2. Description of the Related Art

FIG. 1 is a cross-sectional view showing an example of a package form (BGA package) which needs a ball forming step.

In FIG. 1, reference numeral 1 denotes a circuit substrate. A bonding pattern 2 is formed on one surface (upper surface) of the circuit substrate 1, and a plurality of pad electrodes 3 which is conductive with the wiring pattern through through-hole electrodes (not shown) are formed on the other surface (lower surface).

An IC chip 4 is mounted through a bonding material such as an Ag paste or the like on the one surface of the circuit substrate 1. The IC chip 4 is connected to the bonding pattern 2 through bonding wires 5 made of metal or the like.

The IC chip 4 and the bonding wires 5 are integrally shielded with a mold resin 6. Furthermore, the other surface of the circuit substrate 1 is protected by a resist 7 except for the portions of the pad electrodes 3. Then, a solder-ball 8 is formed on each of the pad electrodes 3 formed on the other surface of the substrate 1.

The conventional solder-ball mounting apparatus used in the BGA package ball forming step and its working flow will now be described with reference to FIG. 2.

First of all, in step S1, a ball suction jig 11 and a ball feed jig 12 are brought into contact with each other as indicated by dotted arrows. The solder-balls B which are received in the ball feed jig 12 are collected on the side of the ball suction jig 11. A hollow space 13 of the ball suction jig 11 is kept under a vacuum condition by the vacuum suction. As a result, the solder-balls B are sucked by respective ball suction holes 14 in communication with the hollow space 13.

Subsequently, the ball suction jig 11 and the ball feed jig 12 are turned over together upside down, and thereafter, are separated away from each other as indicated by dotted arrows. At this time, the solder-balls B are held under section on the respective ball suction holes 14 of the ball suction jig 11 by the suction force caused by the vacuum suction. The solder-balls B other than the sucked balls fall down toward the bottom of the ball feed jig 12 by their gravitational force.

It should be noted that there is another method for sucking the solder-balls B to the ball suction holes 14 of the ball suction jig 11, in which the solder-balls B are aligned on a ball alignment jig 15 in advance in accordance with the arrangement of the ball suction holes 14, and the balls are sucked to the ball suction holes 14 of the ball suction jig 11.

On the other hand in step S2, a suitable amount of flux F is applied to a plurality of pad electrodes (not shown) formed on the circuit substrate P by using a coating nozzle 16.

Subsequently, after the ball suction jig 11 has been positioned above the circuit substrate P, the ball suction jig 11 is moved toward the circuit substrate P. The solder-ball B suction-held by the ball suction holes 14 are fed on the bad electrodes (not shown) of the circuit substrate P through the flux F. Furthermore, the vacuum suction of the ball suction jig 11 is stopped so that the hollow space 13 is returned back to the atmospheric pressure. As a result, the solder-balls B are released from the ball suction holes 14 and are mounted on the circuit substrate P by the adhesion of the flux F.

Thereafter, the circuit substrate on which the solder-balls B have been thus mounted are fed and heated in, for example, a reflow furnace so that the solder-balls B on the circuit substrate P are molten to form spherical solder-balls B on the pad electrodes. Thereafter, the flux component which resides on the surface of the circuit substrate P is removed through a cleaning step.

However, the above-described conventional amounting apparatus suffers from the following disadvantages since very fine and light-weight solder balls having a diameter of 1 mm or less are handled.

(1) A coating film such as a thin oxide film or a contamination film is formed on surfaces of the solder-balls received in the ball feed jig 12 so that static electricity is charged on the ball surfaces and the solder-balls are liable to be adhered to each other. For this reason, when the solder-balls B are sucked by the ball suction holes 14 of the ball suction jig 11, the other solder-balls B are adhered to one hole like grapes. Accordingly, in order to suck the solder-balls to respective ball suction holes 14 one by one, such a troublesome work that the extra solder-balls B are removed after the suction of the solder-balls B or the solder-balls B are aligned on the ball aligning jig 15 as described above is necessary.

(2) In order to positively suck the solder-balls B on all of a number (100 to 400) of ball suction holes provided in the ball suction jig 11, it is necessary to turn over the ball suction jig 11 as described above. This is troublesome and becomes a hindrance against the automation.

(3) When the solder-balls B are fed to the circuit substrate P by the ball suction jig 11, the adhesive force of the flux F is weak, and the solder-balls B would be left on the ball suction hole 14 only by returning the hollow space 13 back to the atmospheric pressure. For this reason, the appearance inspection is carried out after mounting the solder-balls B on the circuit substrate P. In the case where a ball mount removal (i.e., the pad electrodes on which the solder-balls B have not been mounted) is found, a repair work is necessary.

SUMMARY OF THE INVENTION

A first object of the present invention is to positively suck solder-balls on ball suction holes for a short period of time in a solder-ball mounting apparatus.

A second object of the present invention is to smoothly feed solder-balls to a circuit substrate or the like in a solder-ball mounting apparatus.

According to the present invention, there is provided an apparatus for mounting solder-balls on a plurality of pad electrodes formed on a circuit substrate, comprising a ball suction jig having a plurality of ball suction holes formed in a jig body in correspondence with an electrode pattern of the substrate and a hollow space formed in an interior of the jig body in communication with each of the ball suction hole for sucking and holding the solder-balls by vacuum sucking the hollow space; a ball feed jig having a ball tank receiving a predetermined number of the solder-balls for feeding the solder-balls to the ball suction jig through an opening portion of the ball tank; and a blow means for agitating the solder-balls received in the ball tank.

According to the present invention, there is provided an apparatus for mounting solder-balls on a plurality of pad electrodes formed on a circuit substrate, comprising a ball suction jig having a plurality of ball suction holes formed in a jig body in correspondence with an electrode pattern of the substrate and a hollow space formed in an interior of the jig body in communication with each of the ball suction hole for sucking and holding the solder-balls by vacuum sucking the hollow space; a ball feed jig having a ball tank receiving a predetermined number of the solder-balls for feeding the solder-balls to the ball suction jig through an opening portion of the ball tank; a blow means for agitating the solder-balls received in the ball tank; a plurality of ball pusher pins slidably inserted into arranged in the ball suction holes in the ball feed jig; a pin block movably disposed within the hollow space in the ball suction jig for supporting the plurality of ball pushers; and a pin drive section for sliding the ball pusher pins in an axial direction of the suction holes.

According to the present invention, even if the ball suction surface of the ball suction jig (formation surface of the ball suction holes) is directed downwardly, it is possible to positively suck and hold the blown-up solder-balls to the respective ball suction holes of the ball suction jig through the opening portion of the ball tank by agitating the solder-balls within the ball tank of the ball feed jig.

Also, according to the present invention, when the pin block is moved in the hollow space by the pin drive section, the ball pusher pins integrally formed with the block is slid in the axial direction of the ball suction holes so that their end portion forcibly push the solder-balls. Thus, all the solder-balls sucked and held by the ball suction holes are transferred from the ball suction jig to the circuit substrate without fail.

DESCRIPTION OF THE PREFERRED EMBODIMENTS

An embodiment of the invention will now be described in detail with reference to the accompanying drawings.

Figure 1:
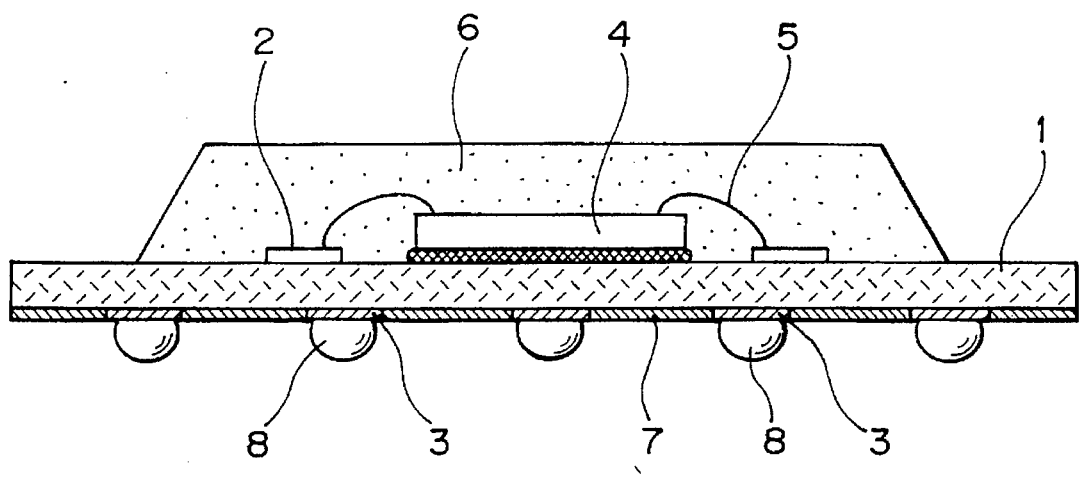
FIG. 1 is a cross-sectional view showing an example of a package melt-bonded with solder-balls.
Figure 2:
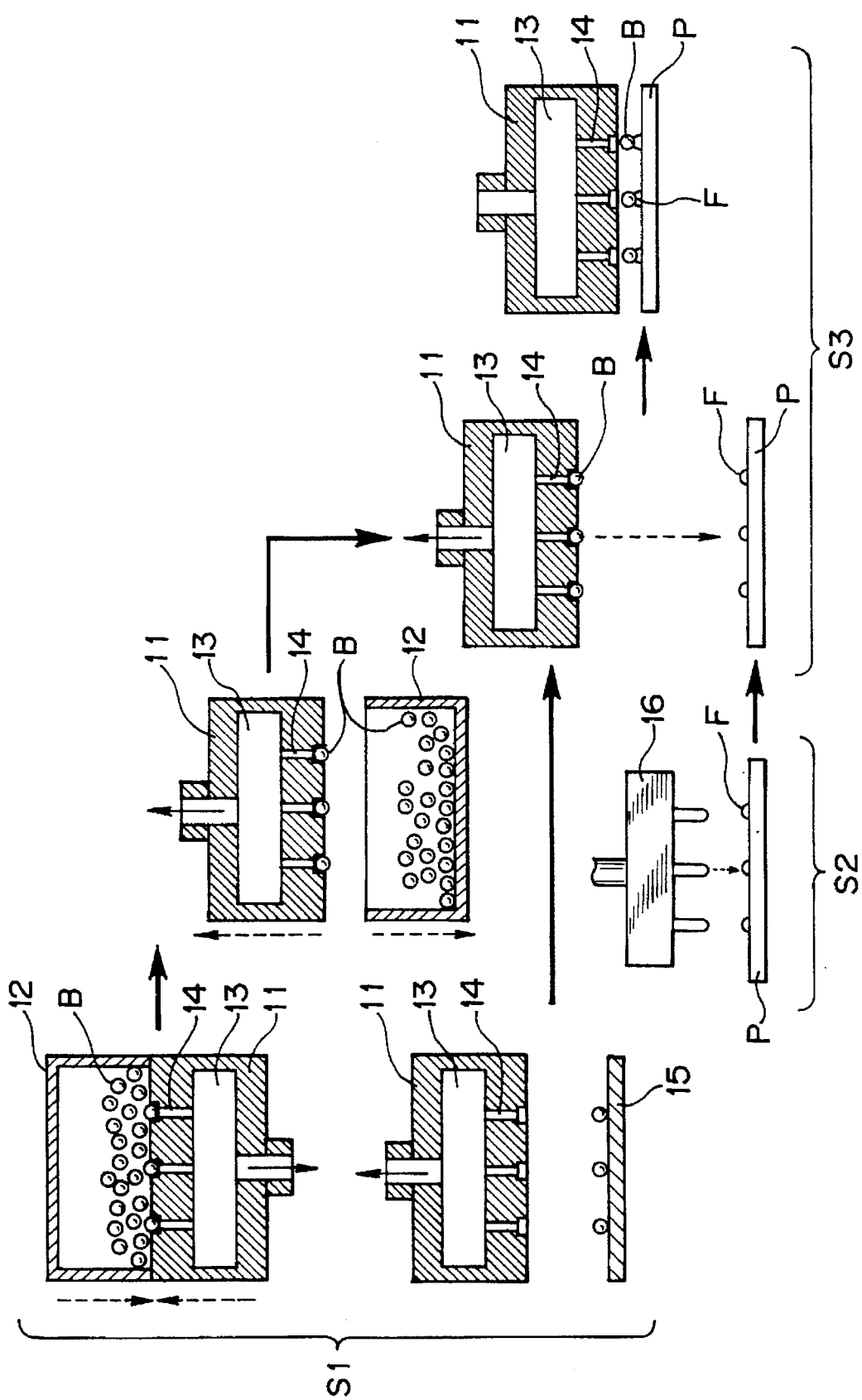
FIG. 2 is a view showing a mounting step using a conventional solder-ball mounting apparatus.
Figure 3A:
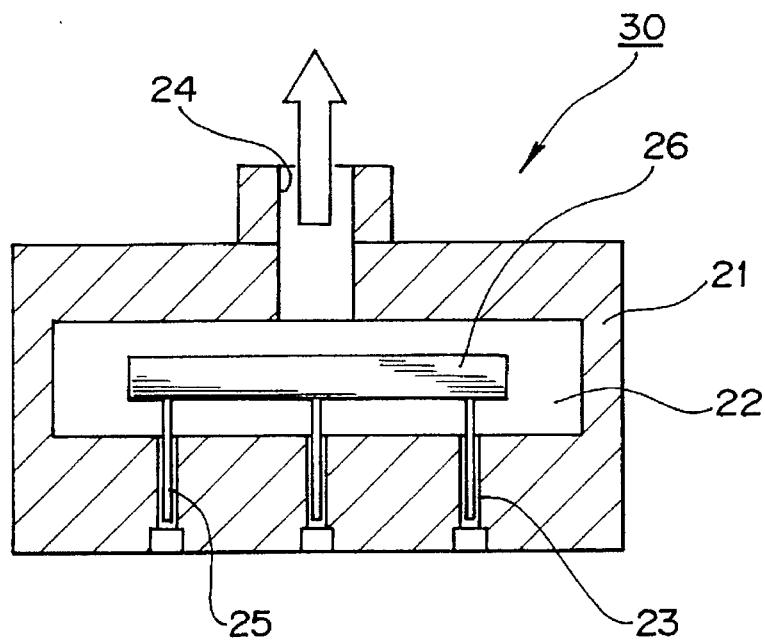
FIGS. 3A to 3C are views illustrating a structure of a ball suction jig in accordance with an embodiment of the invention.
Figure 3B:
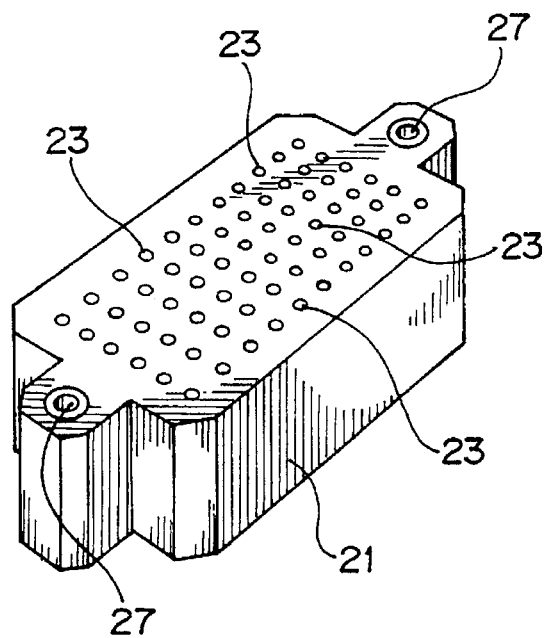
Figure 3C:
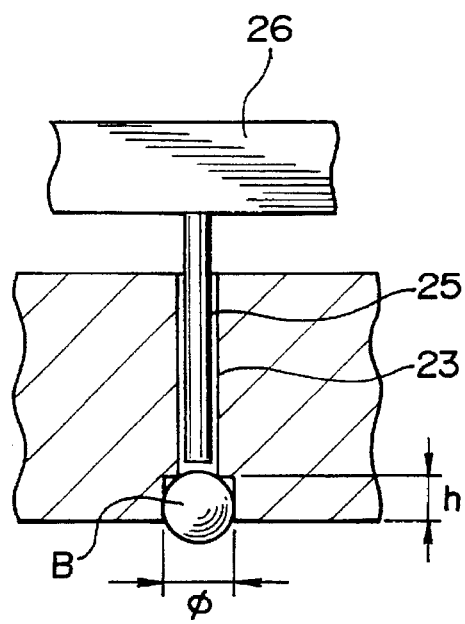

FIGS. 3A, 3B and 3C are views illustrating a structure of a ball suction jig in a solder-ball mounting apparatus in accordance with an embodiment of the invention. FIG. 3A is a side elevational cross-sectional view. FIG. 3B is a bottom side perspective view. FIG. 3C is an enlarged cross-sectional view of a primary part.

In the ball suction jig 20 shown in FIG. 3A, a hollow space 22 is formed in an interior of a jig body 21. A plurality of ball suction holes 23 are formed on a bottom of the jig body 21 in fluid communication with the hollow space 22. The ball suction holes 23 are arranged in, for example, a lattice as shown in FIG. 3B in correspondence with an electrode pattern of a circuit substrate (to be described later).

A suction hole 24 is formed at a top end portion of the jig body 21 for vacuum suction. A vacuum pump is connected through a joint part, an air tube and the like to the suction hole 24. The interior of the hollow space 22 is vacuum-sucked through the vacuum hole 24 by the operation of the vacuum pump so that a vacuum suction force is generated in each of the ball suction holes 23.

Furthermore, ball pusher pins 25 each of which has a smaller diameter than that of the ball suction holes 25 are slidably inserted and arranged in the ball suction holes 23 of the jig body 21.

The tip end portions of the ball pusher pins 25 are arranged at a position where the tip end portions thereof are somewhat retracted from the bottom surface of the jig body 21 so as not to obstruct the suction operation of the solder-balls (to be described later) to the ball suction holes 23.

On the other hand, for example, a plate-like pin block 26 is disposed in the hollow space 21 of the jig body 21. The proximal end portions of the ball pusher pins 25 are fixed to the lower surface of the pin block 26. The pin block 26 is movably supported in the vertical direction in the drawings by a pin drive section (not shown) in which an actuator such as an air cylinder or the like is used as a drive source. Then, when the pin block 26 is moved downwardly by the operation of the pin drive section, the respective ball pusher pins 25 are slid in the axial direction of the ball suction holes 23 together with the pin block 26, and the tip end portions thereof are advanced to inlet portions of the ball suction holes 23.

Now, the seat machining is effected to each inlet portion of the ball suction holes 23 to which the solder-ball is to be sucked. Through the seal machining, a seat diameter $\phi$ is set to be somewhat larger than an outer diameter of the solder-balls B so that the ball position is not laterally displaced when the solder-ball B is pushed by the ball pusher pin 25. In addition, a seat depth h is set to be a dimension (one third to two thirds, more preferably half to two thirds) somewhat smaller than the outer diameter of the solder-ball B so that the adhesive material (to be described later) is not brought into contact with the jig body 21 when the solder-balls B are fed to the circuit substrate (to be described later).

In addition, positioning holes 27 are provided at both end portions of the jig body 21. The positioning holes 27 are formed for relative positioning with the ball feed jig (to be described later).

Figure 4A:
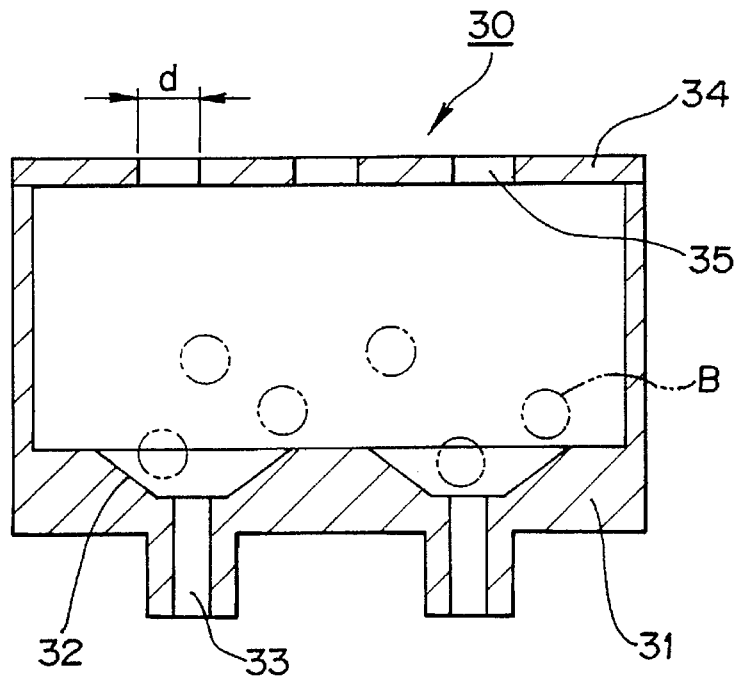
FIGS. 4A and 4B are views illustrating a structure of a ball feed jig in accordance with the embodiment of the invention.
Figure 4B:
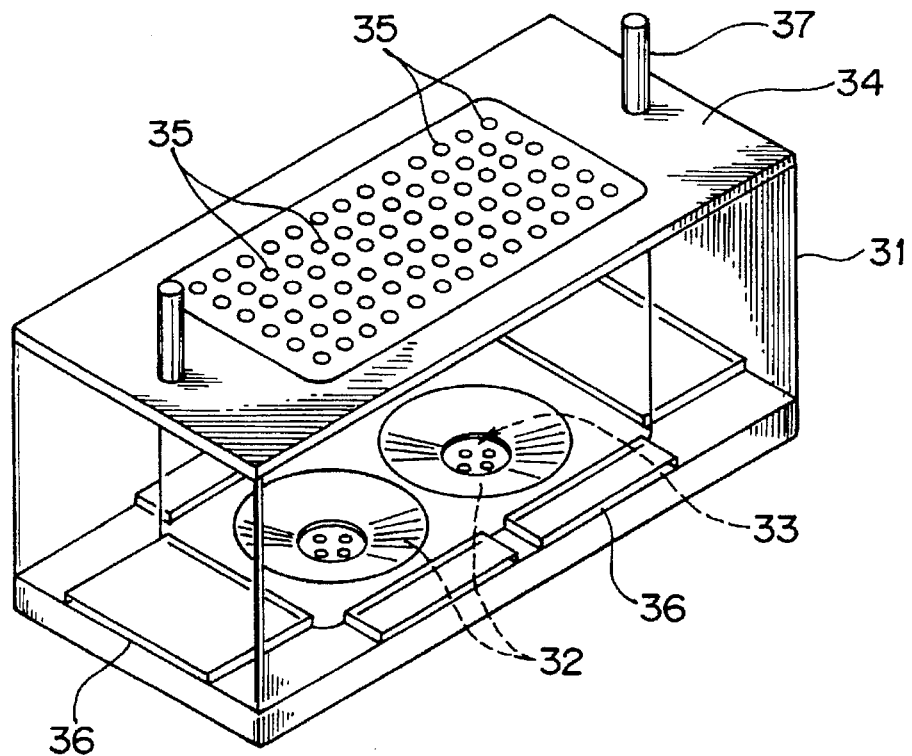

FIGS. 4A and 4B are views illustrating a structure of the ball feed jig in the solder-ball mounting apparatus in accordance with the embodiment of the invention. FIG. 4A is a side elevational cross-sectional view and FIG. 4B is a perspective view.

The ball feed jig 30 shown in FIG. 4A is provided a ball tank 31 which may receive a predetermined number (several thousands to several tens of thousands) of solder-balls B.

For example, tapered ball receivers 32 for collecting the solder-balls B and blowout holes 33 in communication with the ball receivers 32 are provided as a blow means for agitating the solder-balls B in the bottom of the ball tank 31. A blow gas feed source (for example, a compressor) is connected to the blowout holes 33 in communication with the ball receivers 32 through joint member, air tubes and the like (not shown).

Also, a thin plate-like guide mask 34 is mounted on an opening portion of the ball tank 31. A plurality of ball through-holes 35 are formed in correspondence with the arrangement pattern of the ball suction holes 23 formed in the above-described suction jig 20. Each of the ball through-holes 35 is formed to have a diameter d which is larger than the diameter of the solder-balls B so as to allow the solder-balls B to pass therethrough with ease.

On the other hand, slits 36 in communication with the interior of the ball tank 31 for ventilating the gas are formed on side walls of the ball tank 31. The blow gas may be released to the outside through the slits 36.

Positioning pins 37 are provided through the guide mask 34 at both end portions of the ball tank 31. The positioning pins 37 are inserted into the positioning holes 27 of the above-described ball suction jig 20 so that a high precision positioning alignment may be performed to the jigs.

Figure 5:
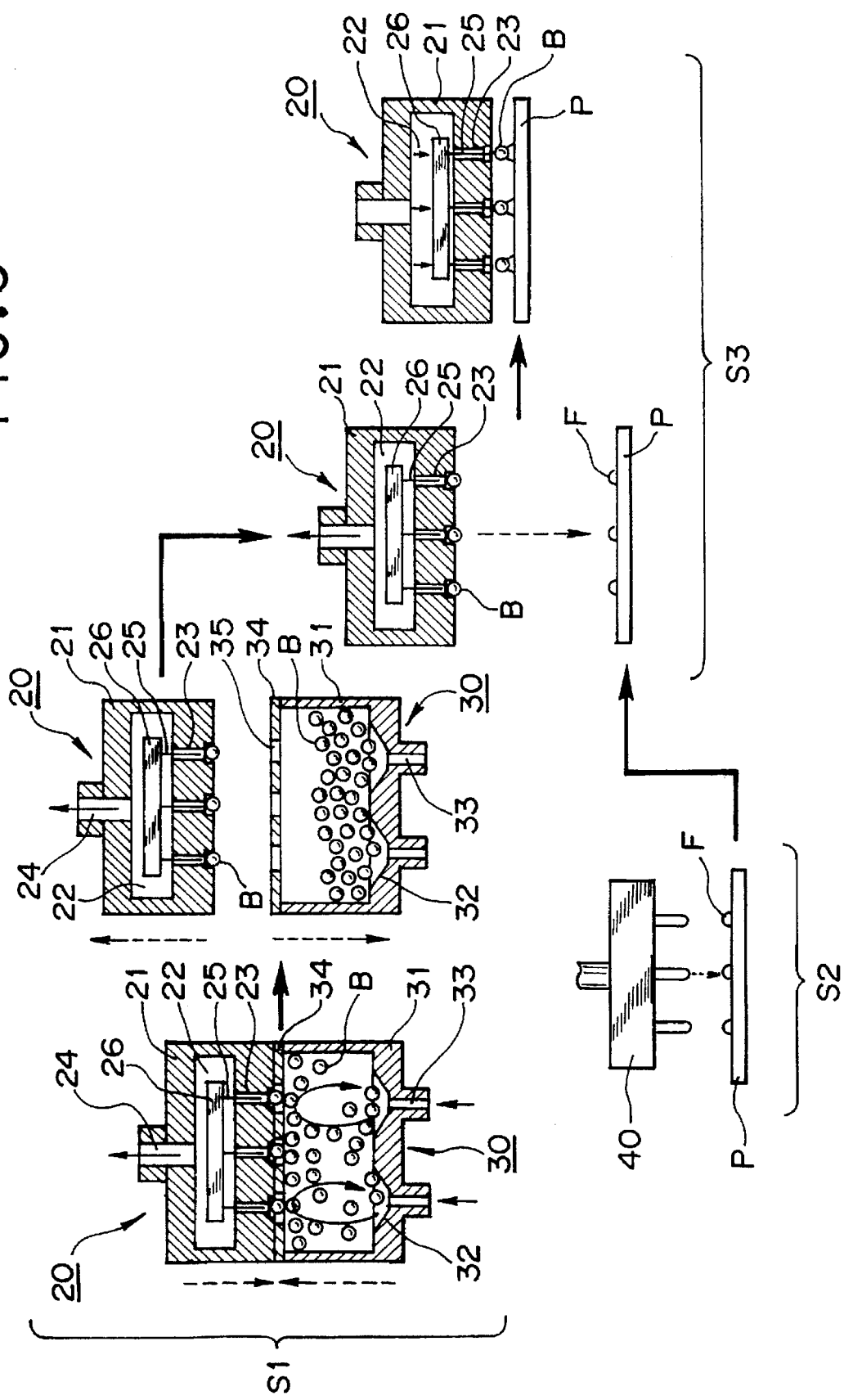
FIG. 5 is a view illustrating the operation of the apparatus according to the embodiment.

The operational steps of the thus constructed mounting apparatus will be explained with reference to FIG. 5.

First of all, in step S1, as described above, the jig body 21 and the ball tank 31 are brought into intimate contact with each other through the guide mask 34 while inserting the positioning pins 37 (FIG. 4B) into the positioning holes 27 (FIG. 3B). Under this condition, the hollow space 22 is vacuum sucked through the suction holes 24 of the jig body 21 by the operation of the vacuum pump (not shown). Also, at the same time, the blow gas is blown out from the blowout holes 23 of the ball tank 31 by the operation of the blow gas feed source.

Thus, since the hollow space 22 of the jig body 21 is kept under the vacuum condition, the vacuum suction force is generated to each ball suction hole 23 in communication with the hollow space 22. Also, since the convection is generated in the interior of the ball tank 31 by the feed of the blow gas, a large number of solder-balls B are blown up together and are agitated within the tank.

At this time, a part of the solder-balls B that has been blown up is sucked to the ball suction holes 23 of the ball suction jig 20 through the ball through-holes 35 of the guide musk 34.

Incidentally, in accordance with the experimental results obtained by the present inventors, it was confirmed that two hundred or more solder balls B might be sucked to the ball suction holes 23 for a short period of time, i.e., several seconds.

By the way, the solder-balls B that have not passed through the ball through-holes 35 of the guide mask 34 fall down to the bottom of the ball tank 31. However, in accordance with the embodiment, since the tapered ball receivers 32 are provided in the tank bottom, the fallen solder-balls B are smoothly collected to the ball receivers 32 and are again blown up in the gas. For this reason, the agitating efficiency of the solder-balls B is enhanced up to a high level, and it is possible to suck all the solder-balls B onto the ball suction holes 23 for a shorter period of time.

Furthermore, although a regular air may be used as a blow gas for ball agitation, if a blow gas such as a nitrogen gas is fed from the blowout holes 33 of the ball tank 31, it is possible to suppress the generation of the oxide film on the ball surfaces to effectively prevent the charge of the static electricity. It is therefore possible to eliminate a disadvantage of the bonding with the solder-balls B.

Subsequently, after a constant period of time has lapsed, the blowout of the blow gas from the blowout holes 33 is stopped by stopping the drive of the blow gas feed source. Thereafter, the positioning holes 27 (FIG. 3B) is drawn away from the positioning pins 37 to separate the jig body 21 from the ball tank 31.

At this time, even if the extra solder-balls are attached to the solder-ball B sucked to the ball suction hole 23, since the extra solder-balls B are forcibly removed by the guide mask 34, it is possible to positively suck and hold the solder-balls B to all the ball suction holes 23 one by one.

On the other hand, in step S2, a suitable amount of adhesive material (flux in this case) is applied to a plurality of pad electrodes (not shown) formed on the circuit substrate P in the same manner as in the conventional case.

Subsequently, in step S3, after the ball suction jig 20 is located above the circuit substrate P, the jig body 21 is advanced to the circuit substrate P. The solder-balls B sucked and held by the ball suction holes 23 are fed onto the pad electrodes (not shown) of the circuit substrate P through the flux F. Furthermore, the vacuum suction of the ball suction jig 20 is stopped to return the hollow space 22 back to the atmospheric pressure. The pin block 26 is moved downwardly by the operation of the pin drive section (not shown).

Figure 6:
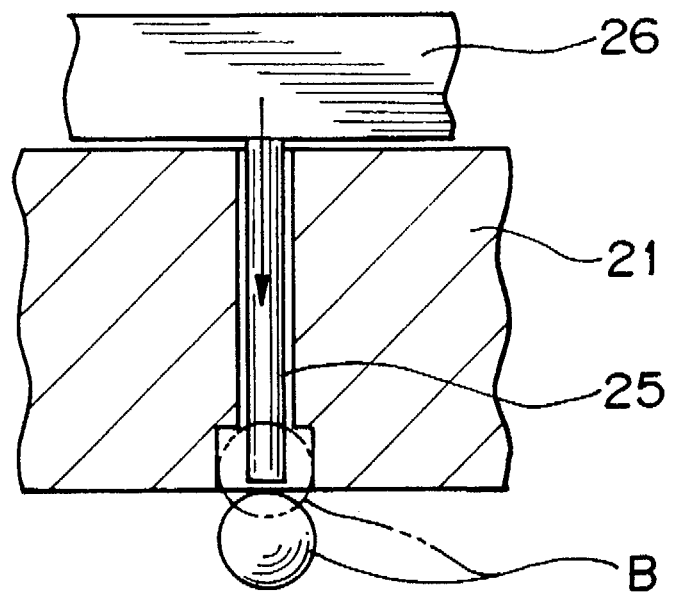
FIG. 6 is a view illustrating the ball pushing operation.

Thus, as shown in FIG. 6, all the ball pusher pins 25 are slid in the axial direction of the ball suction holes 23 together with the pin block 26 so that their tip end portions push the solder-balls B onto the circuit substrate P.

As a result, each solder-ball B is forcibly pushed from the ball suction holes 23 to be transferred to the circuit substrate P and is mounted on the pad electrode (not shown) of the circuit substrate P by the adhesive force of the applied flux F.

Thereafter, after the ball suction jig 20 has been separated above the circuit substrate P, the jig 20 is again aligned with and coupled with the ball feed jig 30. The jigs are ready for the next mounting operation.

In the embodiment, as shown in FIG. 3B, since the seat machining is effected to the inlet portion of each ball suction hole 23, it is possible to restrict the suction position of the solder-ball B under the ball suction condition and to prevent the solder-balls B from being displaced laterally in mounting the balls. Also, since a part of the solder-ball B is projected from the bottom surface of the jig body 21 in the ball suction, it is possible to prevent the adhesive material (flux F) from sticking to the jig body 21 in the ball mounting operation.

Thereafter, the circuit substrate P on which the solder-balls B have been mounted are fed into and heated in the reflow furnace in the same way as in the conventional case. The solder-balls B are molten on the circuit substrate P to form the spherical solder-balls B on the pad electrodes. Thereafter, at the time when the residual flux component on the circuit substrate P is removed through the cleaning step, a series of ball forming steps have been completed.

In the mounting apparatus according to the embodiment, without turning over the ball suction jig 20, with the ball suction surface of the jig body 21, i.e., the surface in which the ball suction holes 23 are formed being directed downwardly, the blow gas is blown out from the blowout holes 33 of the ball feed jig 30 so that the solder-balls B are agitated within the ball tank 31 and the solder-balls B may be positively sucked to the ball suction holes 23 one by one.

Also, when the solder-balls B sucked and held by the ball suction jig 20 are fed to the circuit substrate P, the pin block 26 is moved within the hollow space 22 by the pin drive section so that the respective ball pusher pins 25 are moved slidingly in the axial direction of the ball suction holes 23 to forcibly push the solder balls B. Therefore, all the solder-balls B which have been sucked and held by the ball suction holes 23 may be transferred without fail from the ball suction jig 20 to the circuit substrate P.

Furthermore, if the flux coating step and the ball mounting step are connected with each other, since a period of time until the solder-balls B are mounted may be shortened after the flux F is coated on the circuit substrate P, the viscosity or the quality of the flux F is stabled and it is possible to shorten a working lead time and to enhance the yield of the ball mounting step. Also, the ball mounting step and the reflow step are connected with each other, since the positional displacement of the solder-balls B due to the delivery between the steps may be eliminated, it is possible to enhance the yield of the ball forming step.

Incidentally, a solder is generally well known as a material of the solder-balls but it is possible to use a Cu (copper) ball other than the solder-ball for a solder-ball B that may be handled in the mounting apparatus according to the present invention. Also, the invention is not limited to a BGA package as a package form to which the invention is applied.

As described above, according to the present invention, even if the ball suction surface of the ball suction jig (formation surface of the ball suction holes) is directed downwardly, it is possible to positively suck the solder-balls one by one to the respective ball suction holes of the ball suction jig by agitating the solder-balls within the ball tank of the ball feed jig.

As a result, it is possible to dispense with a troublesome work such as removing the extra solder-balls from the ball suction jig or aligning the solder-balls in advance on the ball aligning jig. Also, since it is unnecessary to turn over the ball suction jig, it is possible to considerably enhance the workability and to simplify the operation of the jig, which is suitable for automation.

Also, according to the present invention, the solder-balls sucked and held by the ball suction holes are forcibly pushed by the ball pusher pins so that all the solder-balls sucked and held by the ball suction holes may be smoothly fed from the ball suction jig to the circuit substrate.

As a result, it is possible to mount, without fail, the solder-balls onto all the pad electrodes formed on the circuit substrate. It is therefore possible to considerably enhance the yield of the ball mounting step. Also, since the appearance inspection or repair step is unnecessary in the ball mounting step, it is possible to reduce the number of the steps correspondingly.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What we claim is:

1. An apparatus for mounting solder-balls on a plurality of pad electrodes formed on a circuit substrate, comprising:
   a ball suction jig having a plurality of ball suction holes formed in a jig body in correspondence with an electrode pattern of the substrate and a hollow space formed in an interior of the jig body in communication with each of the ball suction holes;
   a ball feed jig having a ball tank receiving the solder-balls for feeding the solder-balls to said ball suction jig through an opening portion of said ball tank; and
   a blow means for agitating the solder-balls received in said ball tank, said blow means comprising blow out holes arranged through a bottom wall of said ball tank and connectable to a supply of pressurized gas, and said bottom wall comprises annular concave ball receivers surrounding said blow out holes.

2. The apparatus according to claim 1, wherein said opening portion comprises a guide mask having a plurality of ball through-holes formed in correspondence with an arrangement pattern of the ball suction holes and arranged adjacent said ball suction jig.

3. The apparatus according to claim 1, wherein said ball suction jig has separate suction holes at positions where the balls are mounted on the substrate, and a shape of each suction hole is such that the balls are entered into seat holes.

4. The apparatus according to claim 3, wherein a depth of the seat is one third to two thirds of a diameter of the balls.

5. The apparatus according to claim 1 further comprising a plurality of ball pusher pins slidably received in said ball suction holes in said ball feed jig to push said solder-balls onto said pad electrodes of the circuit substrate.

6. The apparatus according to claim 1, wherein said apparatus is connected to an apparatus for performing a flux application.

7. The apparatus according to claim 1, wherein said apparatus is connected to a ball reflow apparatus.

8. An apparatus for mounting solder-balls on a plurality of pad electrodes formed on a circuit substrate, comprising:
   a ball suction jig having a plurality of ball suction holes formed in a jig body in correspondence with an electrode pattern of the substrate and a hollow space formed in an interior of the jig body in communication with each of the ball suction holes;
   a ball feed jig having a ball tank receiving the solder-balls for feeding the solder-balls to said ball suction jig through an opening portion of said ball tank;
   a blow means for agitating the solder-balls received in said ball tank;
   a plurality of ball pusher pins slidably inserted into the ball suction holes in said ball feed jig;
   a pin block movably disposed within the hollow space in said ball suction jig for supporting said plurality of ball pushers; and
   a pin drive section for sliding said ball pusher pins in an axial direction of the suction holes.

9. The apparatus according to claim 8, wherein said opening portion comprises a guide mask having a plurality of ball through-holes formed in correspondence with an arrangement pattern of the ball suction holes end arranged adjacent said ball suction jig.

10. The apparatus according to claim 8, wherein said ball suction jig has separate suction holes at positions where the balls are mounted on the substrate, and a shape of each suction hole is such that the balls are entered into seat holes.

11. The apparatus according to claim 10, wherein a depth of the seat is one third to two thirds of a diameter of the balls.

12. The apparatus according to claim 8, wherein said blow means has slits or holes in said ball tank and means for releasing a blow gas to form a convectional flow within said ball tank and accelerating the agitation of the balls.

13. The apparatus according to claim 8, wherein said apparatus is connected to an apparatus for performing a flux application.

14. The apparatus according to claim 8, wherein said apparatus is connected to a ball reflow apparatus.

15. An apparatus for mounting solder-balls on a plurality of pad electrodes formed on a circuit substrate, comprising:
   a ball suction jig having a plurality of ball suction holes formed in a jig body in correspondence with an electrode pattern of the substrate and a hollow space formed in an interior of the jig body in communication with each of the ball suction holes;
   a ball feed jig having a ball tank receiving the solder-balls for feeding the solder-balls to said ball suction jig through an opening portion of said ball tank, wherein said opening portion comprises a guide mask having a plurality of ball through-holes formed in correspondence with an arrangement pattern of the ball suction holes and arranged adjacent said ball suction jig; and a blow means for agitating the solder-balls received in said ball tank.

16. The apparatus according to claim 15, further comprising positioning pins extending upwardly from said opening portion of said ball tank, and said suction jig comprises holes arranged to register with said positioning pins when said ball through-holes register with said pattern of the ball suction holes.

17. The apparatus according to claim 15, wherein said ball suction jig has separate suction holes at positions where the balls are mounted on the substrate, and a shape of each suction hole is such that the balls are entered into seat holes.

18. The apparatus according to claim 15, wherein a depth of the seat is one third to two thirds of a diameter of the balls.

19. The apparatus according to claim 15 further comprising a plurality of ball pusher pins slidably received in said ball suction holes in said ball feed jig on to said pad electrodes of the circuit substrate.

* * * * *